United States Patent [19]

Uchida et al.

[11] Patent Number: 5,128,740
[45] Date of Patent: Jul. 7, 1992

[54] SEMICONDUCTOR INTEGRATED CIRCUIT DEVICE WITH ISOLATION GROOVES AND PROTRUDING PORTIONS

[75] Inventors: Akihisa Uchida, Higashiyamoto; Katsumi Ogiue, Hinode; Toru Koizumi, Musashimurayama; Keiichi Higeta, Ohme, all of Japan

[73] Assignee: Hitachi, Ltd., Tokyo, Japan

[21] Appl. No.: 437,824

[22] Filed: Nov. 17, 1989

[30] Foreign Application Priority Data

Nov. 17, 1988 [JP] Japan .................. 63-291927
Jan. 20, 1989 [JP] Japan .................... 1-9737
Jan. 30, 1989 [JP] Japan ................... 1-22172

[51] Int. Cl.⁵ ............................... H01L 27/02
[52] U.S. Cl. ........................ 357/43; 357/59; 357/34; 357/55; 357/50; 357/49
[58] Field of Search ............... 357/34, 43, 55, 59 A, 357/59 H, 59 K, 50, 49, 41

[56] References Cited

U.S. PATENT DOCUMENTS 4,808,548  2/1989  Thomas et al. ............... 437/57
4,887,145  12/1989  Washio et al. ............... 357/34 X
4,910,575  3/1990  Komeda et al. .............. 357/49 X Primary Examiner—William Mintel
Assistant Examiner—Roy Potter
Attorney, Agent, or Firm—Antonelli, Terry, Stout & Kraus

[57] ABSTRACT

This invention relates to a semiconductor integrated circuit device including highly self-aligned bipolar transistors. The semiconductor integrated circuit device a semiconductor body at least a first protruding portion and a hollow portion, disposed as a trench. The hollow portion being adjacent to the first protruding portion and being lower than an upper surface of the first protruding portion and including an isolation groove which is formed along a side surface of the protruding portion and in self-alignment with a peripheral edge portion of the upper surface of the first protruding portion. The device also has insulating material formed on a surface of the hollow portion so as to fill the insulation groove, a first semiconductor region of a first conductivity type formed in the first protruding portion, a portion of said first semiconductor region being exposed to the side surface of the protruding portion, a second semiconductor region of a second conductivity type opposite to the first conductivity type formed in the first protruding portion on the first semiconductor region, a third semiconductor region of the second conductivity type formed in the first protruding portion under the first semiconductor region and a polycrystalline silicon film formed on the insulating material in contact with at least the portion of the first semiconductor region exposed to the side surface of the protruding portion.

26 Claims, 11 Drawing Sheets

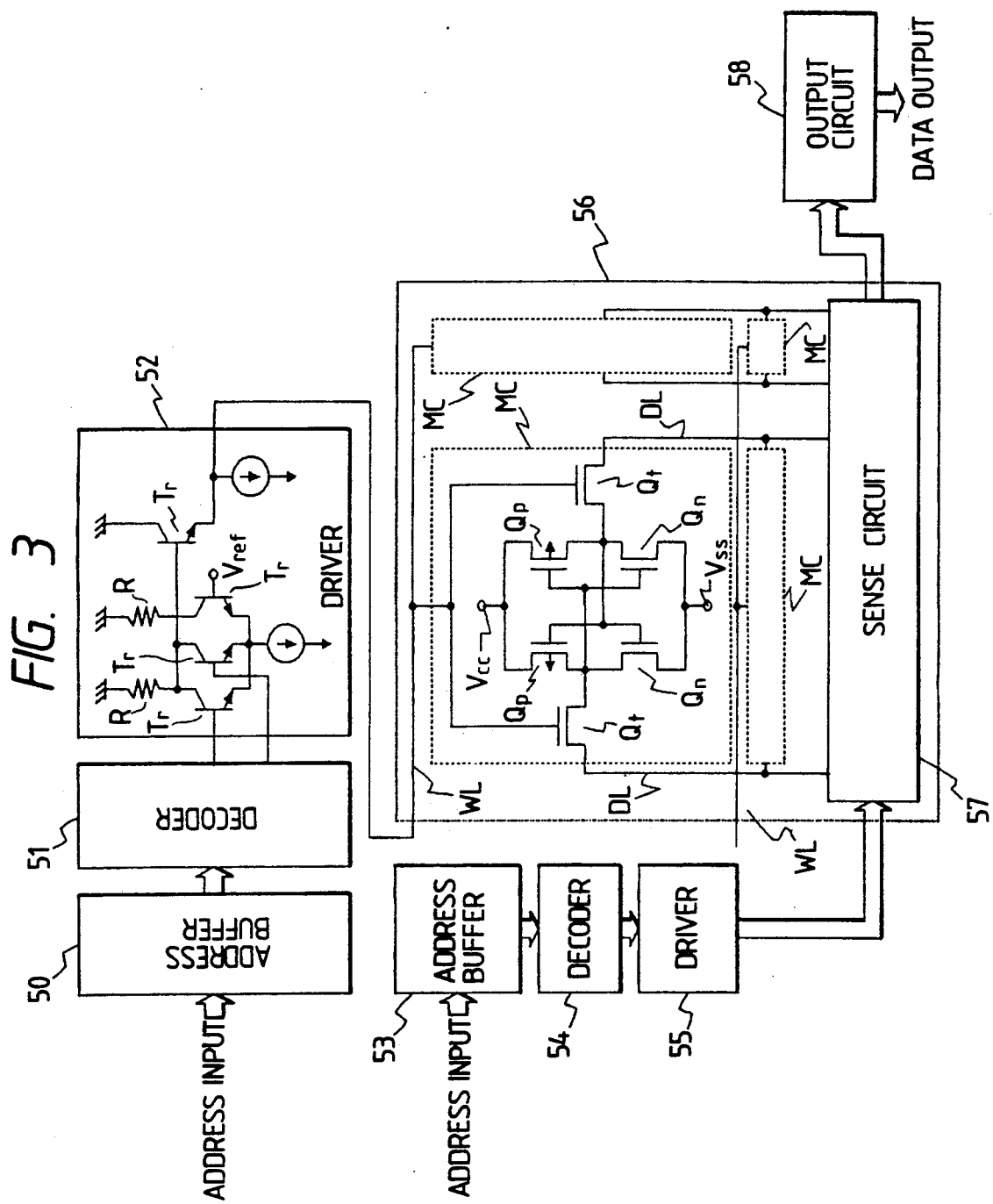

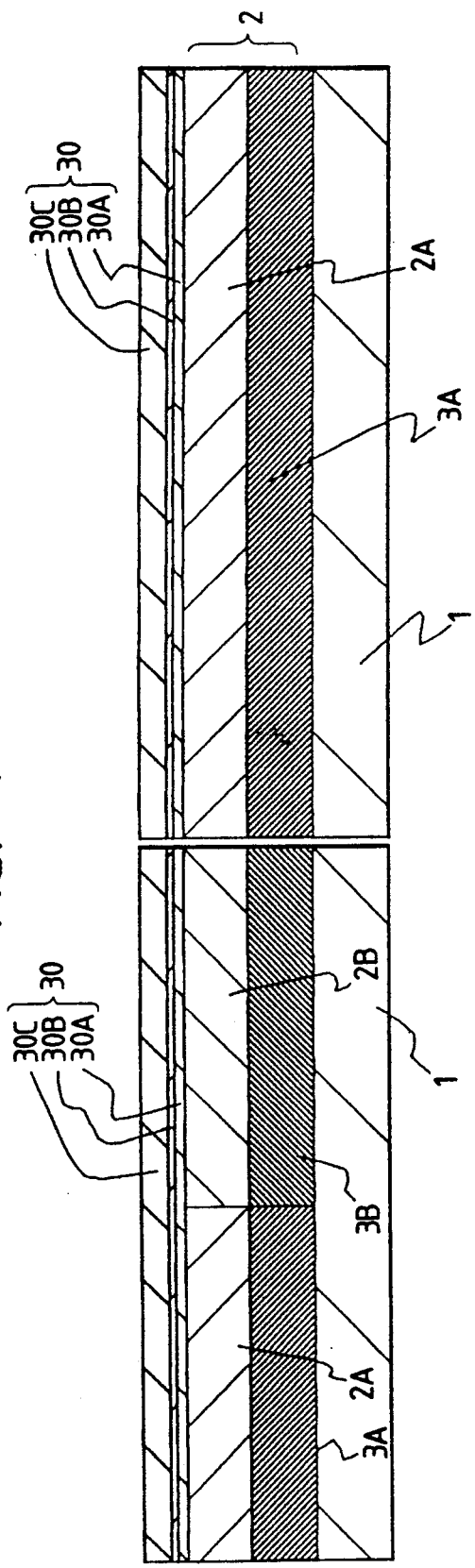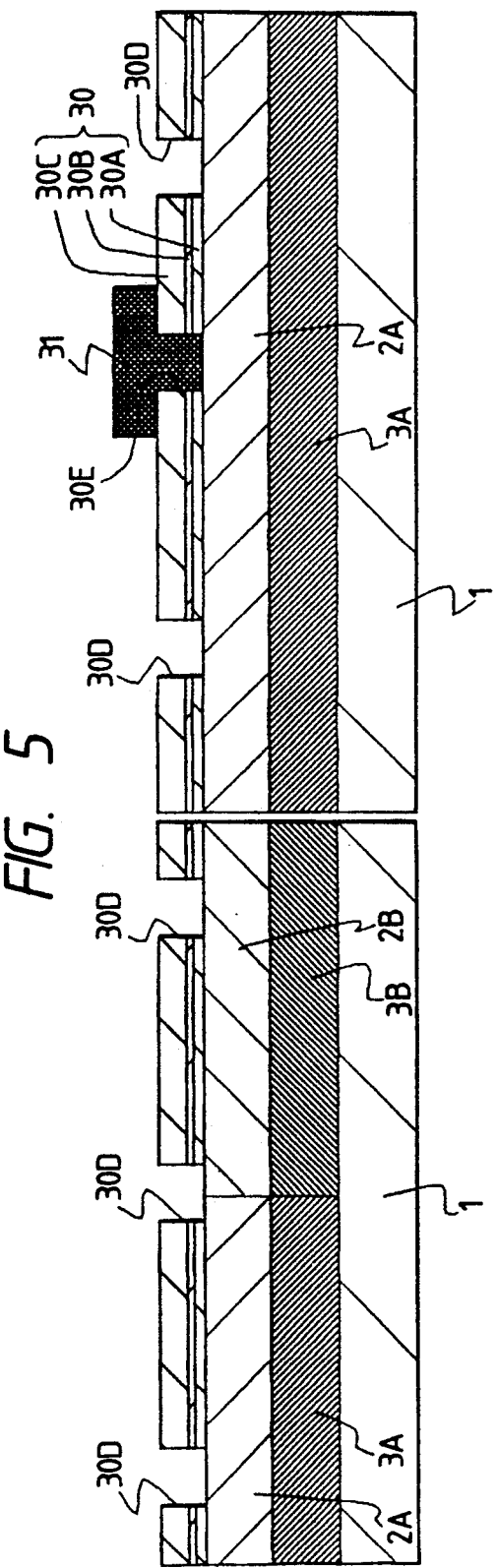

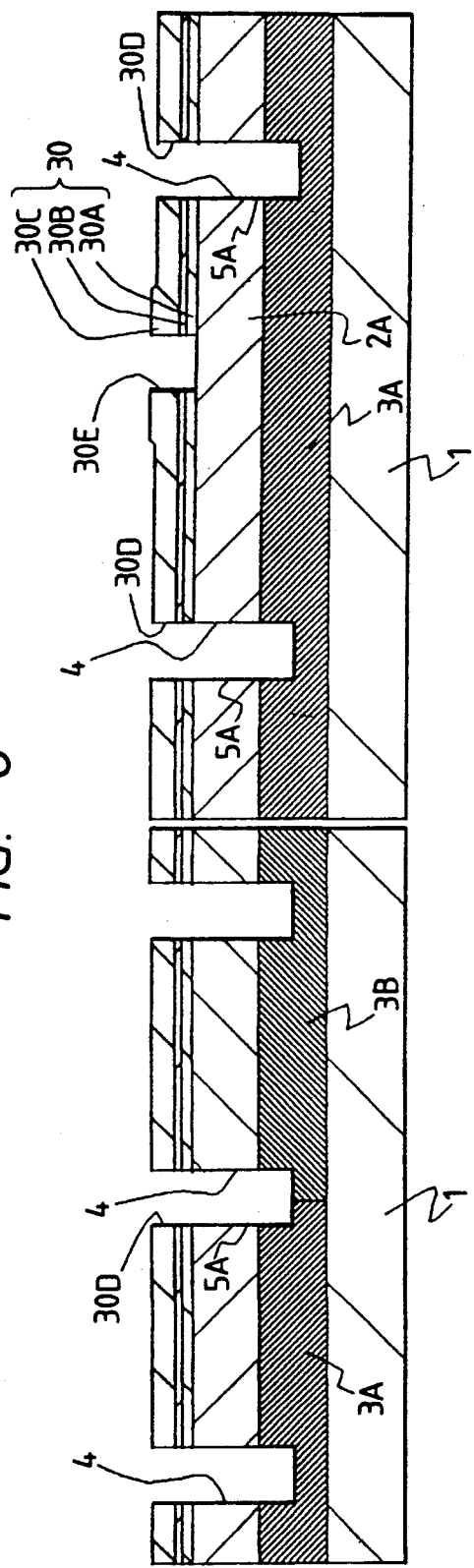
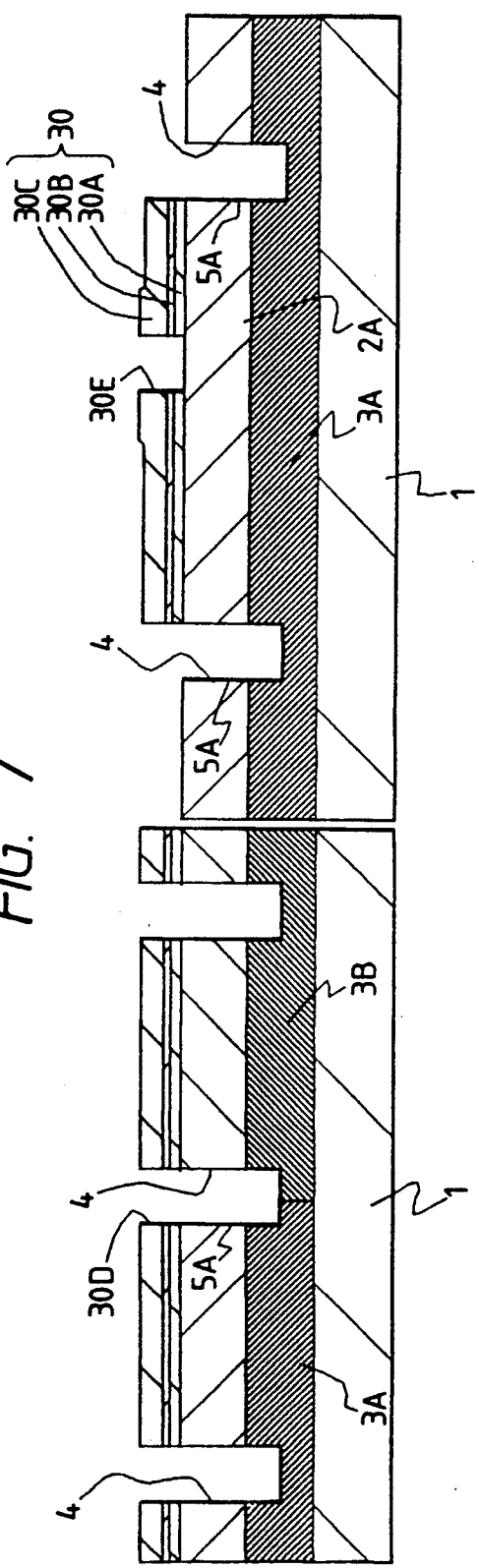

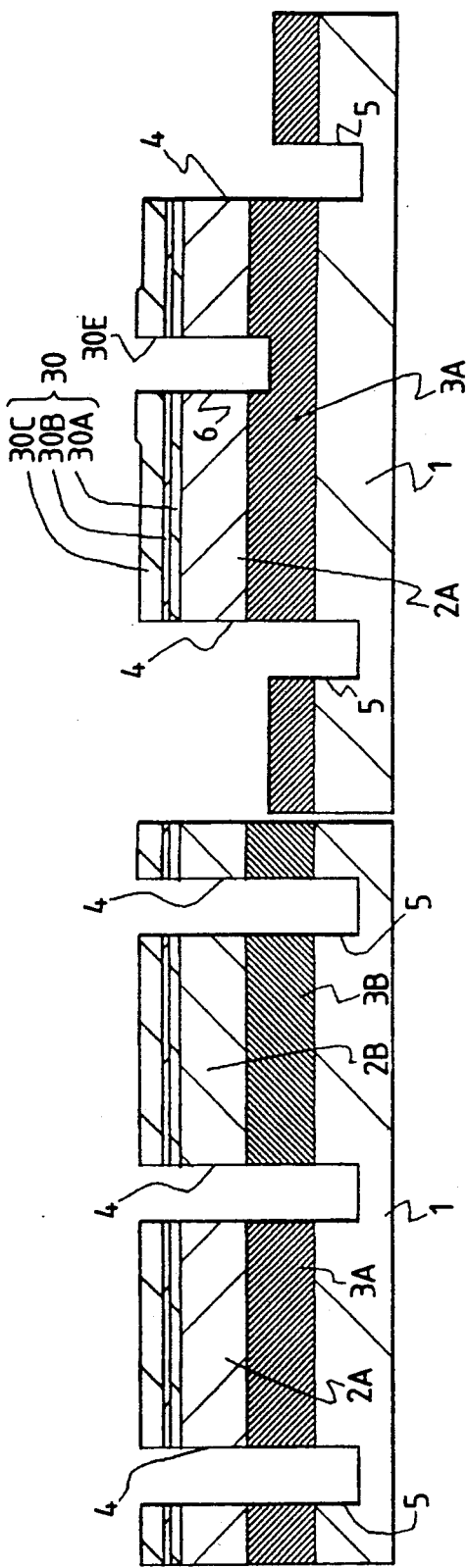
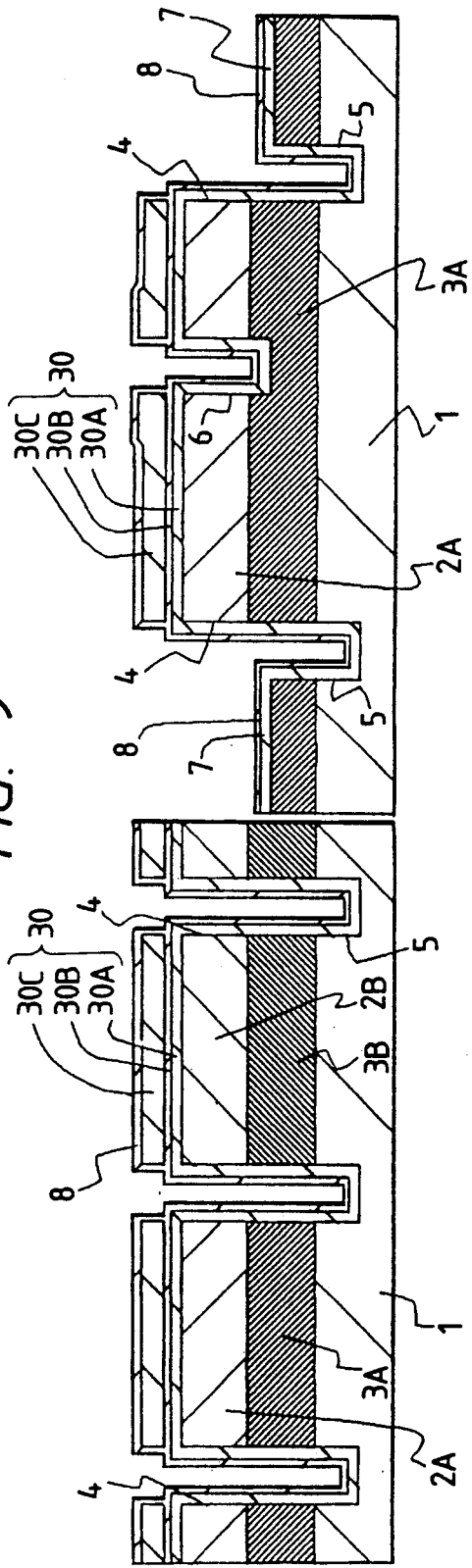

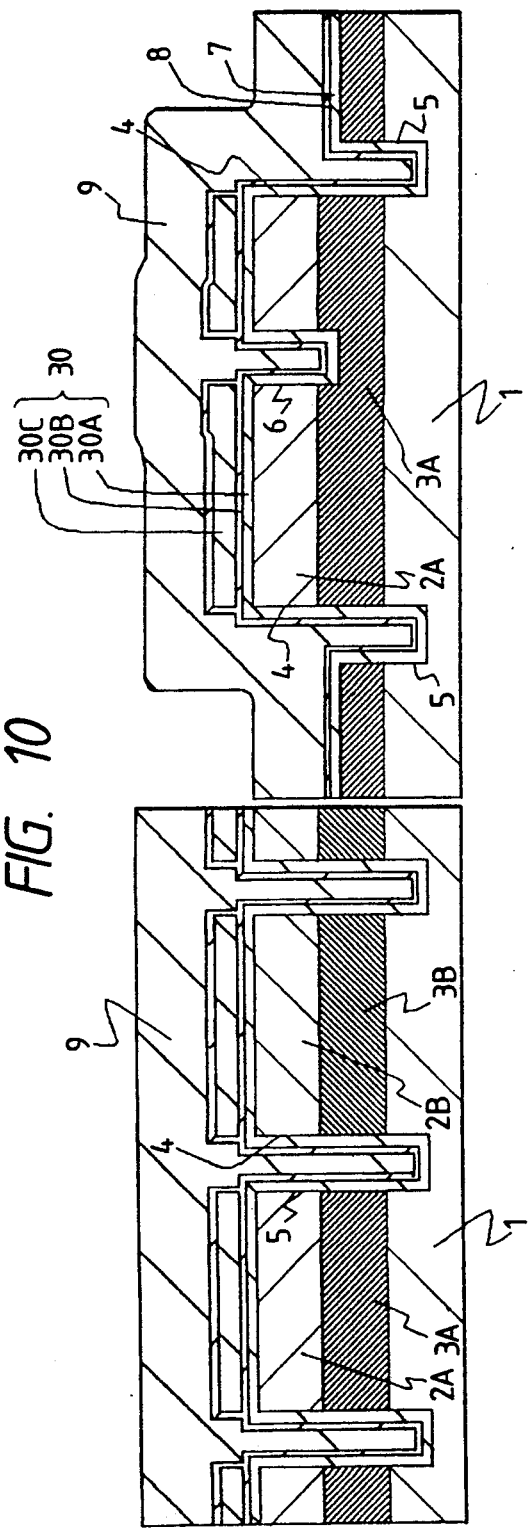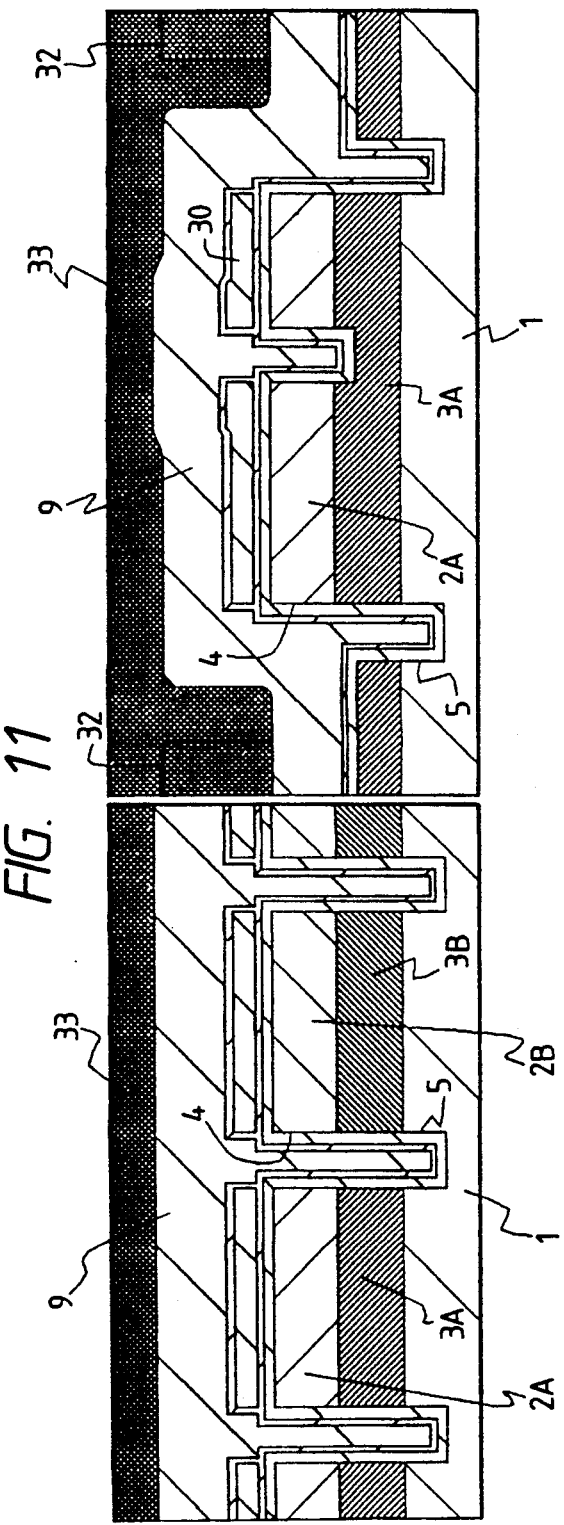

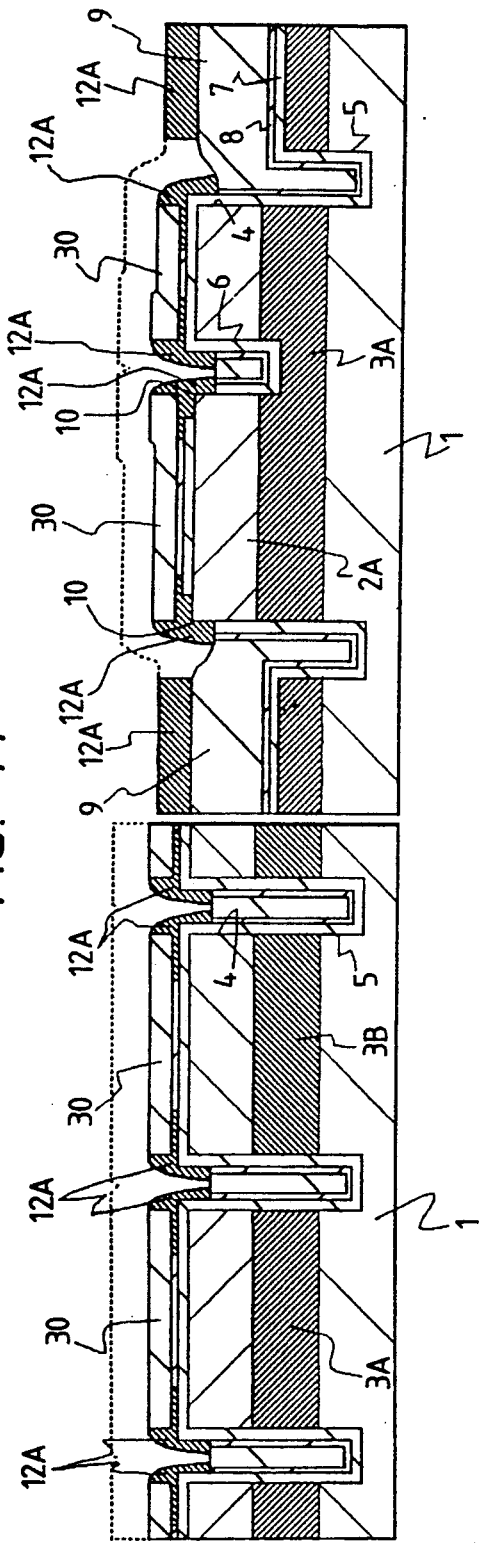
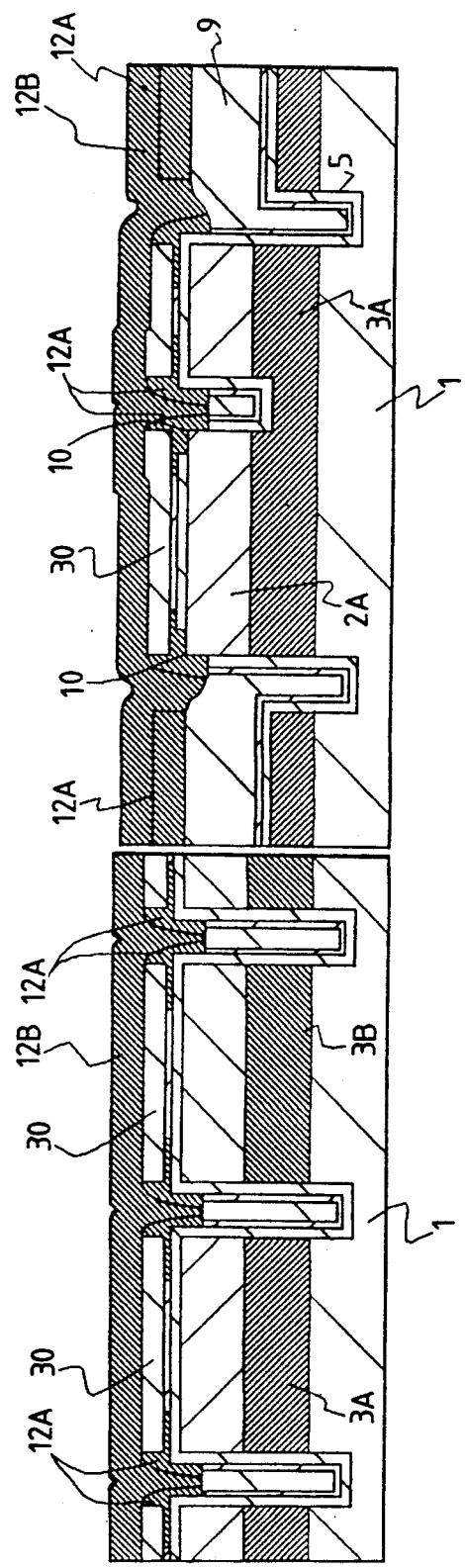

SEMICONDUCTOR INTEGRATED CIRCUIT DEVICE WITH ISOLATION GROOVES AND PROTRUDING PORTIONS

BACKGROUND OF THE INVENTION

This invention relates to a semiconductor integrated circuit device. More particularly, the present invention relates to a technique which will be effective when applied to a semiconductor integrated circuit device having self-alignment type bipolar transistors inside a region defined by an element isolation region for isolating semiconductor elements from each other.

The bipolar transistor which is now being developed by the inventor of the present invention employs an SICOS (Side Wall Base Contact Structure) structure disclosed in Japanese Patent Laid-Open No. 95662/1988. A so-called "self-alignment type" bipolar transistor employing this SICOS structure has a low parasitic capacitance formed in each of the emitter, base and collector regions and can therefore obtain high frequency characteristics at a low current.

The self-alignment type bipolar transistor is formed in a protruding (convex) island region which is in turn formed in an active region of a semiconductor substrate. The operation regions of the emitter, base and collector regions are formed vertically in the protruding island region from its main plane in the direction of depth of the semiconductor substrate. A graft base region is disposed on the side wall (shoulder portion) of the protruding island region and a base lead-out electrode is connected to this graft base region in self-alignment therewith. An emitter lead-out electrode is connected to the emitter region. Each of the emitter region and emitter lead-out electrode is formed in self-alignment with the base lead-out electrode.

The island region in which the self-alignment type bipolar transistor is to be formed is encompassed by the element isolation region and is electrically isolated from other island regions disposed on the semiconductor substrate. The element isolation region consists primarily of thin trenches, an insulating film disposed inside and along each thin trench and a buried material buried into the thin trench through the insulating film. The thin trench is formed at a position spaced-apart by a predetermined distance from the protruding island region. This thin trench is formed by etching anisotropically the semiconductor substrate by RIE or the like. The insulating film formed along the surface of the thin trench is a silicon dioxide film formed by thermally oxidizing the semiconductor substrate on the surface of the thin trench. The buried material is formed selectively only inside the thin trench by depositing a polycrystalline silicon film on the entire surface of the semiconductor substrate by CVD (Chemical Vapor Deposition) and etching back the polycrystalline silicon film thus deposited. The device isolation region of this kind has a small occupying area because the thin trench is formed by anisotropic etching having a small side etching quantity, and can therefore improve the integration density of the semiconductor device.

SUMMARY OF THE INVENTION

The element isolation region described above is formed at the position spaced apart by a predetermined distance from the protruding island region in which the self-alignment type bipolar transistor is to be formed. This distance is decided by adding a necessary dimension for securing a crystal defect margin to the masking allowance dimension. The masking allowance dimension is a masking allowance dimension effected in the fabrication step between the protruding island region and the thin trench of the element isolation region. The dimension for securing the crystal defect margin is a separation dimension lest crystal defects that might occur inside the substrate when the insulating film (silicon dioxide film) is formed in the thin trench by thermal oxidation affect adversely the characteristics of the self-alignment type bipolar transistor. Since the buried material is an electric conductor, the insulating film formed inside the thin trench is as thick as from about 300 to about 450 nm. The reason why the insulating film formed inside the thin trench has a great thickness is because a margin for wet-etching must be large enough for a thin insulating film to be formed at the upper part of the side wall in order to bring the base lead-out electrode into contact with the side wall of the protruding region in self-alignment. For this reason, since the area increases between the self-alignment type bipolar transistor and the element isolation region, the inventors of the present invention have found that the integration density of the semiconductor integrated circuit device drops, accordingly.

Since the buried material buried into the thin trench of the element isolation region is a conductor, it has a high dielectric constant and increases the parasitic capacitance added to the self-alignment type, bipolar transistor. Thus, the present inventors have found still another problem in that the operation speed of the self-alignment type bipolar transistor drops.

It is an object of the present invention to provide a technique capable of improving the integration density in a semiconductor integrated circuit device having self-alignment type bipolar transistors inside a region encompassed by an element isolation region.

It is another object of the present invention to provide a technique which can accomplish the object described above and can improve the operation speed.

It is still another object of the present invention to provide a technique capable of forming a self-alignment type bipolar transistor and an element isolation region in self-alignment in a semiconductor integrated circuit device having self-alignment type bipolar transistors inside a region defined by a device isolation region.

It is a further object of the present invention to provide a technique capable of improving the integration density in a semiconductor integrated circuit device having self-alignment type bipolar transistors inside a region defined by an element isolation region and MOSFETs in other regions.

The above and other objects and novel features of the present invention will become more apparent from the following description of the specification taken in conjunction with the accompanying drawings.

Various aspects typifying the invention disclosed herein are briefly described as follows.

(1) In a semiconductor integrated circuit device having self-alignment type bipolar transistors in a protruding island region defined by an element isolation region, the element isolation region is composed of a thin trench formed around this protruding island region in self-alignment with it and an insulating material buried in this thin trench.

(2) The insulating material disposed in the thin trench of the element isolation region is made of a dielectric that is deposited.

(3) In a semiconductor integrated circuit device having self-alignment type bipolar transistor in a protruding island region defined by a device isolation region and having MOSFETs in other regions, the device isolation region is composed of a thin trench formed around the protruding island region in self-alignment with it and an insulating material buried in the thin trench.

(4) In a fabrication method of a semiconductor integrated circuit device having self-alignment type bipolar transistors in a protruding island region defined by a element isolation region, the fabrication method in accordance with the present invention includes the steps of depositing an active layer, which is used for forming the operation regions, on a main plane of a substrate, forming a mask on the main surface of the formation region of the protruding island region of this active layer, forming a thin trench reaching the substrate in the active layer and forming the protruding island region by the active layer inside the region defined by this thin trench, and filling selectively an insulating material into the thin trench and forming the element isolation region.

According to the construction (1) described above, the integration density of the semiconductor integrated circuit device can be improved considerably because the separation dimension between the protruding island region, in which the self-alignment type bipolar transistor is to be formed, and the element isolation region can be reduced by the distance corresponding to the masking allowance dimension in the fabrication steps.

According to the construction (2) described above, since the proportion of the insulating material, which is to be formed by thermal oxidation, can be reduced among the insulating material filled into the thin trench of the element isolation region, it becomes possible to reduce the crystal defect due to thermal oxidation in or near the protruding island region, to reduce a leakage current and to improve electrical reliability of the semiconductor integrated circuit device. Furthermore, since an insulating material having a lower dielectric constant than that of a conductor is disposed inside the thin trench of the element isolation region, it becomes possible to reduce the parasitic capacitance added to the self-alignment type bipolar transistor and to improve the operation speed of the semiconductor integrated circuit device.

According to the construction (3) described above, the integration density of the semiconductor integrated circuit device can be improved because the separation dimensions between the protruding island region in which the self-alignment type bipolar transistor is to be formed and the element isolation region, between a MOSFET and the element isolation region, between the self-alignment type bipolar transistors and between the self-alignment type bipolar transistor and MOSFET can be reduced.

According to the fabrication method (4) described above, substantially all of the protruding island region, the thin trench of the element isolation region, and the like, can be formed in self-alignment with one mask defining the protruding island region being as the reference.

BRIEF DESCRIPTION OF THE DRAWINGS

FIG. 3 is a system block diagram of a memory system constructed of the Bi-CMOS device in FIG. 1; and FIGS. 4 to 19 are sectional views of the principal portions of the Bi-CMOS device in FIG. 1 that are shown in accordance with the fabrication steps.

DESCRIPTION OF THE PREFERRED EMBODIMENTS

Figure 1:
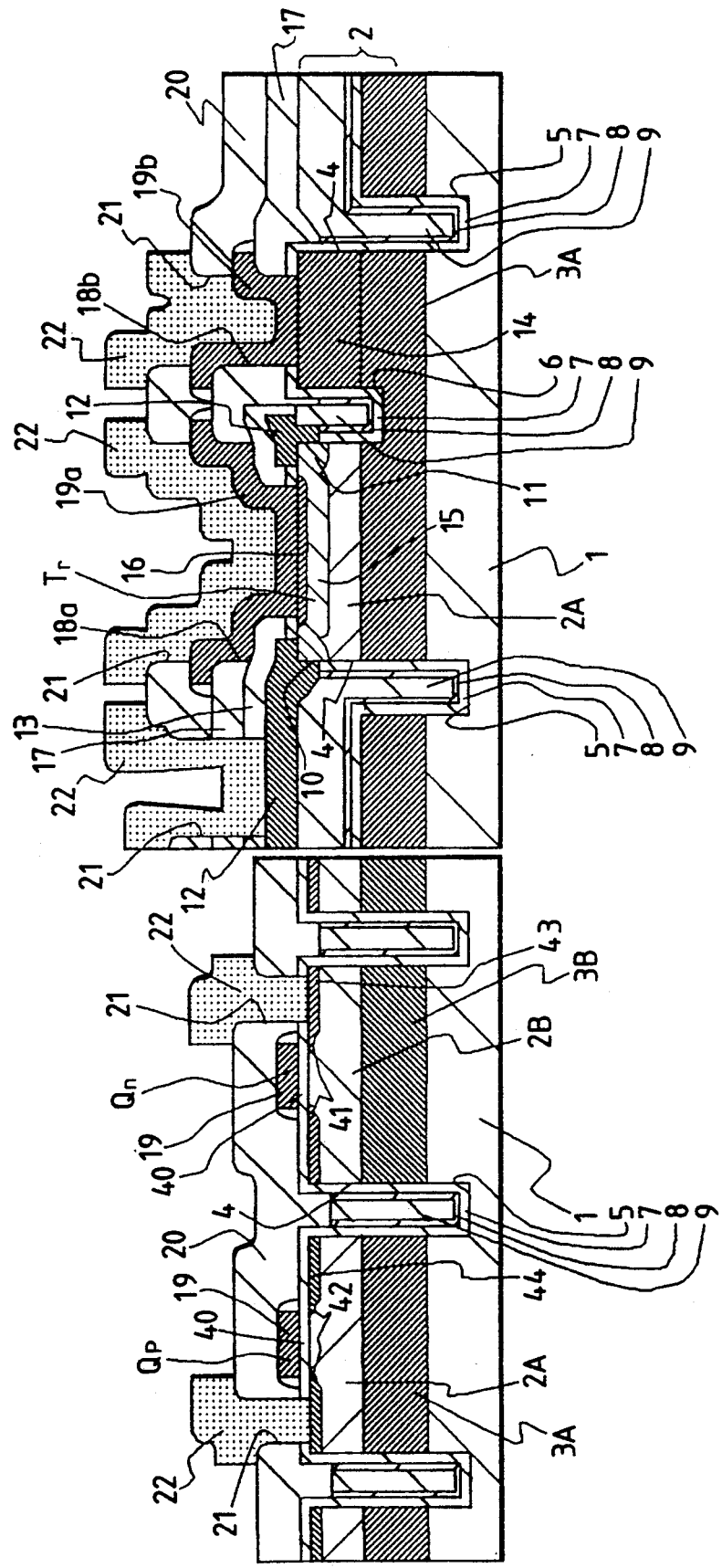
FIG. 1 is a sectional view showing the principal portions of a semiconductor integrated circuit device (Bi-CMOS device) in an embodiment of the present invention.

Hereinafter, the construction of the present invention will be described with reference to a preferred embodiment thereof applied to a semiconductor integrated circuit device (hereinafter referred to as "Bi-CMOS device") having the self-alignment type bipolar transistors employing the SICOS structure and complementary MOSFETs (CMOSs) on the same semiconductor substrate.

Incidentally, like reference numerals will be used to identify like constituent elements throughout all the drawings and repetition of explanation of such constituents will be omitted.

The outline of a memory system constructed of the Bi-CMOS device in an embodiment of the present invention is shown in FIG. 3 (system block diagram).

As shown in FIG. 3, in the memory system constructed of the Bi-CMOS device, peripheral circuits for controlling a memory cell array 56 are disposed around it.

A plurality of memory cells MC are arranged in a matrix form in the memory cell array 56. Each memory cell MC is disposed at the point of intersection between a word line WL and a complementary data line $\overline{DL}$ (DL, $\overline{DL}$) and is connected to them electrically. The word line WL extends in a column direction (X direction) in the memory cell array 56, and the complementary data line $\overline{DL}$ extends in a row direction (Y direction).

The memory cell is constructed of a memory cell of an SRAM (Static Random Access Memory) structure. In other words, each memory cell MC comprises a flip-flop circuit as a data storage portion and two transfer MISFETs Qt connected to its input/output terminals. The transfer MISFET Qt is of an n-channel type. The flip-flop circuit comprises two driving MOSFETs Qn and two load MOSFETs Qp. The driving MOSFET Qn is of the n-channel type in the same way as the transfer MISFET Qt. The load MOSFET Qp is of the p-channel type. In other words, the memory cell MC is constructed of a full CMOS structure. The source region of the load MOSFETs Qp are connected to a power source voltage Vcc, e.g.0V. The source region of the driving MOSFETs Qn are connected to a reference voltage Vss, e.g. −3.2V.

The word line WL is connected to an address buffer circuit 50 through a word driver circuit 52 and an X decoder 51. In other words, the word line WL is connected to the X system peripheral circuits. Though only its part is shown in FIG. 3, this X system peripheral circuit comprises mainly npn bipolar transistors Tr.

The complementary data line $\overline{DL}$ is connected to a Y switch circuit and a sense amplifier circuit 57. The Y switch circuit and the sense amplifier circuit 57 are connected to the address buffer circuit 53 through a driver circuit 55 and a Y decoder circuit 54. In other words, the complementary data line DL is connected to the Y system peripheral circuit. This Y system peripheral circuit comprises mainly the npn bipolar transistors Tr in the same way as the X system peripheral circuit.

The Y switch and the sense amplifier circuit 57 are connected to a data output circuit 58. The data output circuit 58 comprises mainly npn bipolar transistors Tr in the same way as the X- and Y-system peripheral circuits.

In other words, the memory system constructed of the Bi-CMOS device of this embodiment has the memory cell array 56 comprising complementary MOS-FETs Q and the peripheral circuits comprising the bipolar transistors Tr.

Next, the definite structure of the bipolar transistor Tr applied to the Bi-CMOS device will be explained with reference to FIG. 1 (sectional view of the principal portions) and FIG. 2 (plan view of the principal portions). The definite structure of complementary MOS-FET Q applied to the Bi-CMOS device, too, will be explained with reference to FIG. 1.

Figure 2:
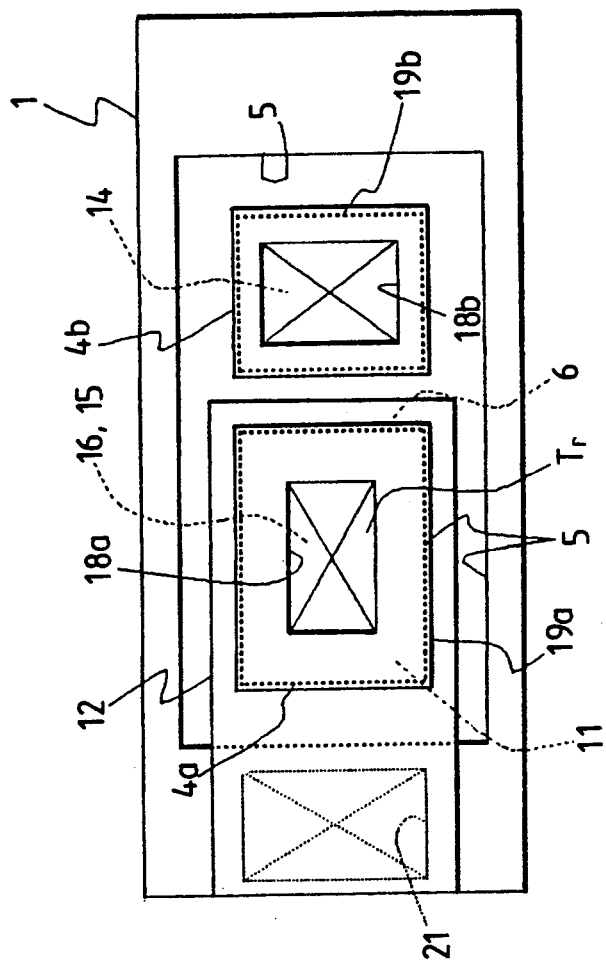
FIG. 2 is a plan view showing the principal portions of the bipolar portion of the Bi-CMOS device in FIG. 1.
Figure 12:
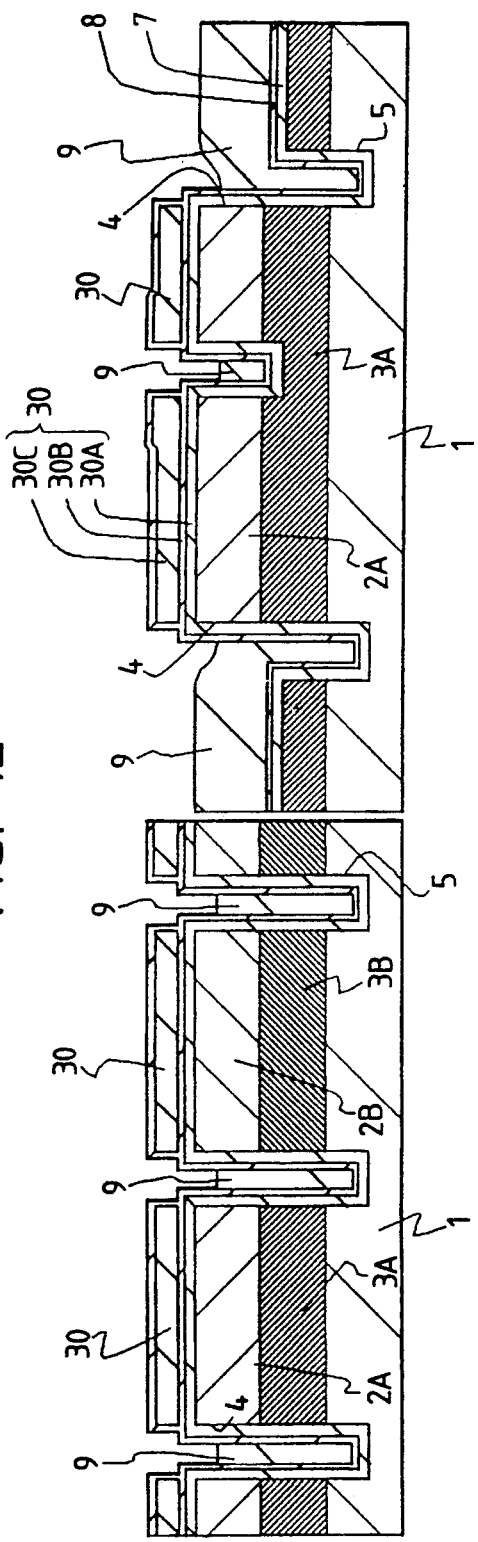

As shown in FIG. 1, in the Bi-CMOS device an $n^-$ epitaxial layer (active layer) 2 is deposited on a main surface of a $p^-$ type semiconductor substrate 1 made of single crystal silicon. The bipolar transistor Tr is electrically isolated by an element isolation region from the other elements formed on the substrate 1 as shown on the right side of FIG. 1 and in FIG. 2. The element isolation region comprises mainly the semiconductor substrate 1, the thin trench (or groove) 5, the insulating films 7, 8 and the buried material 9.

As to the element isolation region described above, an upper surface of the semiconductor substrate 1 defines primarily the bottom portion of the bipolar transistor Tr.

The thin trench 5 is disposed formed so as to surround the protruding island region (active region) 4 where the bipolar, transistor Tr is disposed. That is, it is disposed so as to extend inwardly in the n epitaxial layer 2 and in the semiconductor substrate 1 and has a side wall defining the side surface of the protruding island region 5. Each of the thin trenches 4 has substantially the same trench width and its depth reaches the upper surface of the semiconductor substrate 1 or is deeper than the upper surface. In other words, the bottom portion of the thin trench 5 is formed at a position deeper than at least the later-appearing buried $n^+$ semiconductor conductor region 3A. This buried $n^+$ semiconductor region 3A constitutes a part of the collector region of the bipolar transistor Tr. The thin trench 5 is formed in self-alignment with respect to the protruding island region 4. More definitely, the thin trench 5 is formed in self-alignment with an upper peripheral edge of the protruding island region 4.

Each insulating film 7, 8 is formed along the inner wall of the thin trench 5. The insulating film 7 is comprised, for example, of a silicon dioxide film which is formed by applying thermal oxidation treatment to the surface of the $n^-$ epitaxial layer 2 exposed on the inner wall of the thin trench 5 and to the surface of the semiconductor substrate 1. Since the insulating film 7 is used primarily as a surface passivation film for reducing the surface charge, it uses the silicon dioxide film having high quality as the insulating film. The insulating film 7 can be formed as thin as from 50 to 200 nm, for example. The reason why the insulating film 7 is formed in a thickness of as small as from 50 to 200 nm is to minimize the occurrence of crystal defects and dislocation in the $n^-$ type epitaxial layer 2 due to the stress that occurs at the time of the thermal oxidation treatment. The insulating film 8 is comprised, for example, of a silicon nitride film deposited by CVD. Since it is used as an etching stopper layer at the time of etch-back of the buried material 9 in the fabrication process which will be described elsewhere in detail, the insulating film 8 is made of a material having an etching selection ratio with respect to the insulating film 7.

The buried material 9 is comprised, for example, of the silicon dioxide film deposited by CVD. In comparison with the silicon dioxide film formed by thermal oxidation, the silicon dioxide film deposited applies smaller stress to the semiconductor substrate 1 and $n^-$ type epitaxial layer 2 near the thin trench 5 and makes it more difficult for crystal defects to develop Since comprised of buried material 9 is the insulating material, it has a smaller dielectric constant than that of the conductor such as the polycrystalline silicon film, for example. Those films which have a small stress and low dielectric constant and which can be deposited in a great film thickness may be used as the buried material 9. It may be the silicon dioxide film deposited by sputtering. Though the stress somewhat increases, the silicon nitride film deposited by CVD or an organic resin film may be used as the buried material 9.

The bipolar transistor Tr is formed on the main surface of the semiconductor substrate 1 inside the region which is surrounded by the element isolation region described above. This bipolar transistor Tr comprises an npn bipolar transistor of a vertical structure comprising an n type collector region, a p type base region and an n type emitter region.

The collector region comprises the $n^-$ type well region 2A, the buried type $n^+$ semiconductor region 3A and a collector potential pull-up $n^+$ semiconductor region (which is referred to also as a "sinker") 14. The $n^-$ type well region 2A is disposed on the main plane portion of the $n^-$ type epitaxial layer 2. The buried $n^+$ type semiconductor region 3A is disposed between the semiconductor substrate 1 and the $n^-$ type well region 2A ($n^-$ type epitaxial layer 2) in the protruding island region 4. The collector potential pull-up $n^+$ semiconductor region 14 is disposed on the main plane portion of the $n^-$ type epitaxial layer 2 in a portion of protruding island region 4 excepting a region where the emitter and base regions are disposed.

The bottom portion of this collector potential pull-up $n^+$ semiconductor region 14 is in contact with the buried type $n^+$ semiconductor region 3A. In the formation region of the bipolar transistor Tr, the element isolation region disposed between the protruding island regions 4 comprises the thin trench 6, the insulating films 7, 8 and the buried material 9. The thin trench 6 of this element isolation region is shallower than the thin trench 5 of the element isolation region described already, and the bottom portion of the thin trench 6 extended into a portion only of the buried type $n^+$ semiconductor region 3A.

A collector lead-out electrode 19b is connected to the collector potential pull-up $n^+$ semiconductor region 14 in the collector region through a collector opening 18b which is formed in an inter-level insulating film 17. A wiring 22 is connected to this collector lead-out electrode 19b through a connection hole 21 formed in an inter-level insulating film 20. The collector lead-out electrode 19b is made, for example, of a polycrystalline silicon film deposited by CVD. An n type impurity such as P or As is introduced into this polycrystalline silicon film to reduce the resistance value. The wiring 22 described above is made of an aluminum alloy, for example. This aluminum alloy is prepared by adding Cu or Cu and Si to aluminum. Copper (Cu) has the action of preventing an electromigration and Si has the action of reducing an alloy spike phenomenon, for example.

The base region, described above, comprises the P type semiconductor region 15 as the intrinsic base region and the p type semiconductor region 11 as the graft base region. The p type semiconductor 15 is disposed on the main surface portion of the n⁻ type well region 2A of the protruding island region 4. The p⁺ type semiconductor region 11 is disposed on the main surface portion of the n⁻ well region 2A on the side wall of the protruding island region 4, more definitely, at its shoulder (or upper corner) portion.

The base lead-out electrode 12 is connected to the p⁺ semiconductor graft base region 11 corresponding to a base opening at upper top and side corner surface portions of the protruding island region thereof thereby effecting electrical contact with the entire base region of bipolar transistor TR. The base lead-out electrode 12 comprises a polycrystalline silicon film deposited by CVD, for example. A p type impurity such as B is introduced into this polycrystalline silicon film. This p type impurity reduces the resistance value of the base lead-out electrode 12 and forms the p⁺ semiconductor region 11 as the graft base region by thermal diffusion. The wiring 22 is connected to the base lead-out electrode 12 in the same way as in the collector lead-out electrode 19b.

The emitter region comprises the n⁺ semiconductor region 16. The n⁺ semiconductor region 16 is disposed on the main surface portion of the p type semiconductor intrinsic base region 15 formed in the protruding island region 4.

The emitter lead-out electrode 19a is connected to the n⁺ type semiconductor emitter region 16 through an emitter opening 18 which is formed in the insulating film 17 and the inter-level insulating film 13 on the surface of the base lead-out electrode 12. The emitter lead-out electrode 19a is comprised for example, of the polycrystalline silicon film which is the same conductor film as that of the collector lead-out electrode 19b, for example. An n type impurity is introduced into this polycrystalline silicon film. The n type impurity introduced into this polycrystalline silicon film reduces the resistance value and forms the n⁺ semiconductor region 16 by thermal diffusion. The wiring 22 is connected to the emitter lead-out electrode 19a.

This bipolar transistor Tr can form the p type semiconductor region as the intrinsic base region, the emitter lead-out electrode 19a and the n⁺ semiconductor region 16 as the emitter region in self-alignment with respect to the base lead-out electrode 12. It can also form the base lead-out electrode 12 and the p⁺ semiconductor region 11 in self-alignment with the upper peripheral edge of the protruding island region 4. Accordingly, all of the active regions of the bipolar transistor Tr can be formed in self-alignment with the upper peripheral edge of the protruding island region 4.

Also, the trench 5 of the element isolation region can be formed in self-alignment with this upper peripheral edge of the protruding island region 4. Accordingly, the bipolar transistor Tr has the SICOS structure in which the active(operating) region and the isolation region are formed in self-alignment with each other.

In the semiconductor integrated circuit device including the self-alignment type bipolar transistor Tr comprising the SICOS structure formed in the protruding island region 4 surrounded by the element isolation region, the element isolation region is comprised of the thin trench 5 formed around and in self-alignment with this protruding island region 4, and the buried material (insulating material) 9 disposed inside this thin trench 5. According to this structure, the separation dimension between the protruding island region 4 where the self-alignment type bipolar transistor is formed and the element isolation region can be reduced by the distance corresponding to the masking margin in the fabrication process. Therefore, the integration density of the Bi-CMOS device can be improved.

The element isolation region is formed around, and in self-alignment with, the protruding island region 4 where the self-alignment type bipolar transistor Tr is formed. According to this structure, the planar size of each operation region of the bipolar transistor Tr can be formed substantially equally to one another and particularly, the planar size of the collector region 3A beneath the emitter region 15 can be reduced to that equal level to the planar sizes of the emitter and base regions 16 and 15. For this reason, the parasitic capacitance formed between the collector region and the semiconductor substrate 1 can be reduced. Since the parasitic capacitance added to the self-alignment type bipolar transistor Tr can thus be reduced, the operation speed of the Bi-CMOS device can be improved.

The thin trench 5 of the element isolation region is buried by the buried material made primarily of the deposited insulating material (silicon dioxide film). According to this structure, the proportion of the insulating material (insulating film 7) that is formed by thermal oxidation can be reduced among those which are disposed in the thin trench 5 of the element isolation region. Therefore, the crystal defects that might occur in the protruding island region 4 or in the portions nearby (1 and 2) due to thermal oxidation can be reduced. As a result, since the leakage current between the self-alignment type bipolar transistors Tr adjacent one another can be reduced and the leakage current between the operation regions of each self-alignment type bipolar transistor Tr can be reduced, electrical reliability of the Bi-CMOS device can be improved. Since the insulating material having a lower dielectric constant than that of the conductor is filled as the buried material 9 into the thin trench 5 of the element isolation region, the parasitic capacitance formed between the self-alignment type bipolar transistor Tr and the buried material 9 can be reduced. Since the parasitic capacitance added to the self-alignment type bipolar transistor Tr can thus be reduced, the operation speed of the Bi-CMOS device can be improved.

Since the parasitic capacitance added to the self-alignment type bipolar transistor-. Tr can be reduced, as described above, any variation of characteristics can be effectively reduced. According to the test results of characteristics carried out by the inventors of the present invention, it has been found that the parasitic capacitance can be reduced by about ⅔.

As shown on the left side of FIG. 1, the complementary MOSFET Q is formed on the main surface the n⁻ type epitaxial layer 2 formed on the same p⁻ type semiconductor substrate 1 on which the bipolar transistor Tr described above is formed. The complementary MOSFETs Q are electrically isolated from other elements by the element isolation regions (thin trench 5, etc.) in the same way as the bipolar transistors Tr.

The n-channel MOSFETs Qn such as the transfer MOSFETs Qt, driving MOSFETs Qn, etc, (which will be altogether referred to as "Qn") are disposed on the main surface of the p$^-$ well region 2B. This p$^-$ well region 2B is disposed on the main surface portion of the n$^-$ epitaxial layer 2 in the protruding island region 4 surrounded by the element isolation region. The buried type p$^+$ semiconductor region 3B used as a part of the p$^-$ well region 2B is disposed between the p$^-$ well region 2B and p$^-$ type semiconductor substrate 1.

The n-channel MOSFET Qn is comprised primarily of the p$^-$ well region (channel formation region) 2B, the gate insulating film 40, the gate electrode 19 and each pair of n type semiconductor regions 41 and n$^+$ semiconductor regions 43 serve as the source and drain regions.

The gate insulating film 40 is made of the silion dioxide film which is formed on the main surface of the p$^-$ well region 2B by thermal oxidation, for example. The gate insulating film 40 can be made of a laminate film of the silicon dioxide film described above and a silicon nitride film in order to prevent deterioration of the dielectric withstand voltage due to reduction of the film thickness.

The gate electrode 19 is made, for example, of the polycrystalline silicon film which is the same conductor film as the emitter lead-out electrode 19 of the bipolar transistor Tr described already. An n-type impurity is introduced into this polycrystalline silicon film.

The n-type semiconductor region 41 can construct an n-channel MOSFET Qn having an LDD (Lightly Doped Drain) structure. The n type semiconductor region 41 is formed in self-alignment with the gate electrode 19.

The n$^+$ semiconductor region 43 is formed in self-alignment with respect to the side wall spacer (to which no reference numeral is given) formed on the side wall of the gate electrode 19. The side wall spacer is formed in self-alignment with the gate electrode 19 and is made of a silicon dioxide film, for example. The wiring 22 is connected to the n$^+$ semiconductor region 43 through the connection hole 21 formed in the inter-level insulating film 20.

The p-channel MOSFETs Qp such as the load MOSFETs Qp (p-channel type will be altogether referred to as "Qp") are disposed on the main surface of the n$^-$ well region 2A. The n$^-$ well region 2A is disposed on the main surface of the n$^-$ type epitaxial layer 2 in the protruding island region 4 surrounded by the element isolation region in the same way as in the bipolar transistor Tr. The buried type n$^+$ semiconductor region 3A used as part of the n$^-$ well region 2A is disposed between this n well region 2A and the p$^-$ type semiconductor substrate 1.

The p-channel MOSFET Qp is comprised mainly of the n$^-$ well region (channel formation region) 2A, the gate insulating film 40, the gate electrode 19 and a pair each of p type semiconductor regions 42 and p$^+$ semiconductor regions 44 which serve as the source and drain regions.

This p-channel MOSFET Qp has the LDD structure in the same way as the n-channel MOSFET Qn. The wiring 22 is connected to the p$^-$ semiconductor region 44 of the p-channel MOSFET Qp.

In the Bi-CMOS device having the self-alignment type bipolar transistors Tr in the protruding island region 4 surrounded by the element isolation region and the complementary MOSFETs Q in the other protruding island regions such as the one described above, the thin trench 5 formed around, and in self-alignment with, the protruding island region 4 and the insulating material (insulating films 7, 8 and buried material 9) filled in this trench 5 together form the element isolation region. According to this structure, the separation dimensions can be reduced between the protruding island region 4 in which the self-alignment type bipolar transistor Tr is formed and the element isolation region, between the element isolation region of MOSFET Qn and that of MOSFET Qp, between the self-alignment type bipolar transistors Tr, between the complementary MOSFETs Q and between the self-alignment type bipolar transistor Tr and the complementary MOSFET Q, respectively. Accordingly, the integration density of the Bi-CMOS device can be improved.

Next, the fabrication method of the Bi-CMOS device described above will be explained with reference to FIGS. 4 to 19 (sectional views of the principal portions for each of the fabrication steps).

First of all, an n-type impurity is introduced into the formation regions of each of the bipolar transistor Tr and p-channel MOSFET Qp on the main surface portion of the p$^-$ type semiconductor substrate. Then, a p-type impurity is introduced into the formation region of the n-channel MOSFET Qn on the main surface portion of the p$^-$ type semiconductor substrate 1.

Next, the n$^-$ type epitaxial layer (active layer) 2 is grown on the main surface of the p$^-$ semiconductor substrate 1 into which the n- and p-type impurities are introduced. This growing step of the n$^-$ type epitaxial layer 2 diffuses the n- and p-type impurities that have been introduced, and the buried type n$^+$ semiconductor region 3A and the buried type p$^+$ semiconductor region 3B are formed, respectively.

Next, the n-type impurity is introduced into the formation regions of the bipolar transistor Tr and p-channel MOSFET Qp, respectively, on the main surface of the n$^-$ type epitaxial layer 2. Then, the p-type impurity is introduced into the formation region of the n-channel MOSFET Qn on the main surface of the n$^-$ type epitaxial layer 2.

The n-type impurity thus introduced in then diffused to form the n$^-$ well region 2A and the p-type impurity is diffused to form the p$^-$ well region 2A.

The mask 30 is formed on the main surfaces of the n$^-$ and p$^-$ well regions 2A and 2B, respectively, as shown in FIG. 4. The mask 30 comprises a composite film made of a first mask 30A, a second mask 30B and a third mask 30C that are laminated sequentially from the lower layer side. The first mask 30A uses a silicon dioxide film formed by thermal oxidation, for example, and is from 50 to 100 nm thick. The second mask 30B uses a silicon nitride film deposited by CVD, for example, and is from 100 to 200 nm thick. The third mask 30C uses a silicon dioxide film deposited by CVD, for example, and is from 700 to 800 nm thick.

Next, as shown in FIG. 5, the portions of the mask 30 located on portions where the thin trenches (5, 6) are to be formed are removed, thereby forming the openings 30D and 30E, respectively. In other words, the mask 30 is left in the formation region of the protruding island region (4). Each of these openings 30D, 30E is formed by photolithography and etching. The opening 30D is formed on the region where the deep thin trench (5) of the element isolation region is to be formed. The opening 30E is formed on the region where the shallow thin trench (6) of the element isolation region is to be formed. The openings 30D and 30E have substantially the same trench width such as from 0.8 to 1.0 μm, for example. If the width of the thin trenches 5, 6 which will be later formed by etching and using the mask 30 is more uniform, the buried material 9 can be buried more uniformly.

Next, a mask 31 for covering the opening 30E among the mask 30 described above is formed. This mask 31 is used as an etching mask and is formed by a photoresist film, for example.

Next, as shown in FIG. 6, the main surface portions of the n− and p− well regions 2A and 2B that are exposed from the opening 30D are removed by etching by use of the masks 30 and 31, respectively, to form the thin trench 5A. Anisotropic etching such as RIE is used for this etching. The thin trench 5A is formed as part of the thin trench 5 of the element isolation region in such a depth that its bottom reaches the buried type $n^+$ semiconductor region 3. When this thin trench 5A is formed, part of the protruding island region 4 is formed. Thereafter, the mask 31 is removed selectively as shown in FIG. 6.

Next, as shown in FIG. 7, the mask 30 on the formation region of the element isolation region is removed while the mask 30 on the formation region of the protruding island region 4 among the mask 30 is left. In the region from which the mask 30 is removed, the main surface of the n− well region 2A is exposed.

Anisotropic etching such as RIE is applied to the entire surface of the substrate by use of the remaining mask 30, forming thereby the thin thin trenches (hollow portions) 5 and 6 as shown in FIG. 8. The trench 5 is formed by etching further deeply the thin trench 5A. The thin trench 6 is formed in the main surface of the n− well region 2A inside the region defined by the opening 30E of the mask 30. After this thin trench 5 is formed, the protruding island region 4 is formed in self-alignment with respect to the thin trench 5. The thin trench 5 is formed in such a manner that its bottom portion reaches the semiconductor substrate 1 and moreover, is deeper than the buried type $n^+$ semiconductor region 3A and the buried type $p^+$ semiconductor region 3B. As a result, each of the buried type $n^+$ and $p^+$ semiconductor regions 3A and 3B is formed in self-alignment with respect to the thin trench 5 and to the protruding island region 4, respectively. The thin trench 6 is formed in such a depth as not to cut off the buried type $n^+$ semiconductor region 3A but to come into it. Incidentally, the n− epitaxial layer 2 in the element isolation region is removed together with the formation steps of the thin trenches 5, 6 and the protruding island region 4.

Next, the insulating films 7 and 8 are formed sequentially along the inner walls of the thin trenches 5 and 6, respectively, as shown in FIG. 9. The insulating film 7 is made of the thin silicon dioxide film formed by thermal oxidation, as described already. The insulating film 8 is made of the silicon nitride film deposited by CVD, for example, and is from 50 to 100 nm thick. Incidentally, the insulating film 7 may be made of a high quality silicon dioxide film deposited by CVD.

Next, the buried material 9 is formed over the entire surface of the substrate as shown in FIG. 10. The buried material 9 uses the silicon dioxide film deposited by CVD as described already, and is from 700 to 1,000 nm thick, for example. The buried material 9 has a thickness substantially equal to that of the n− epitaxial layer 2.

A first resist film 32 is formed on the surface of the buried material 9 (the element isolation region) whose surface is concaved, as shown in FIG. 11, and a second resist film 33 is then formed over the entire surface of the substrate. The first resist film 32 is formed in order to make flat the step of the formation region of the protruding island region 4 in the formation region of the bipolar transistor Tr. The first resist film 32, the second resist film 33 and the buried material 9 are formed at substantially equal etching rate.

Next, etching treatment (etch-back) is applied to the entire surface of the substrate and the first resist film 32 and the buried material 9 are sequentially removed from the surface of the second resist film 33 by etching. After this etching, the mask 30 on the protruding island region 4 can be exposed and the buried material 9 can be selectively packed into the thin trenches 5, 6 of the element isolation region while interposing the insulating films 7 and 8 into the thin trenches 5 and 6 of the device isolation region, respectively. Since the buried material 9 on the mask 30 is removed by using the insulating film 8 formed on the mask 30 as the etching stopper, controllability is high.

Figure 13:
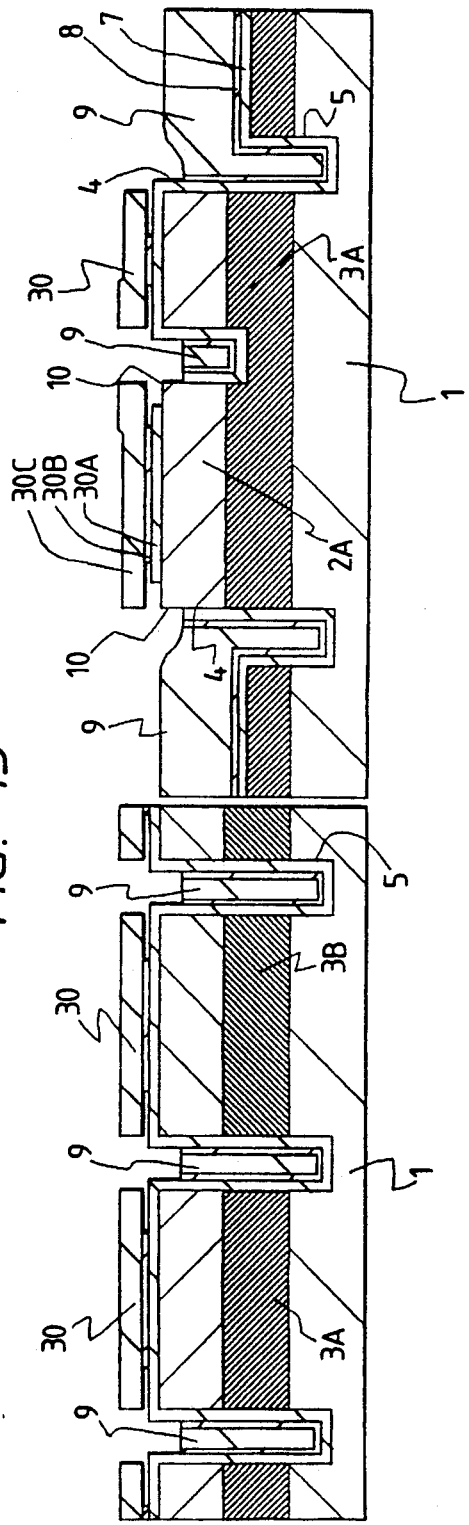

Next, the insulating film 8 at portions other than the portion where the buried material 9 is filled is removed. Then, the insulating film 7 of the formation region of the graft base region on the side wall (shoulder) of the protruding island region 4 in the formation region of the bipolar transistor Tr is removed and the base opening 10 is formed as shown in FIG. 13.

The first layer conductor film 12A in the fabrication process is deposited over the entire surface of the substrate (represented by dotted line in FIG. 14), and anisotropic etching such as RIE is applied only to the portion of the conductor film 12A corresponding to the protruding island region 4 as shown in FIG. 14. The conductor film 12A uses a polycrystalline silicon film deposited by CVD, for example, and a p-type impurity is introduced into this polycrystalline silicon film in order to reduce the resistance value. Anisotropic etching is conducted in a depth corresponding substantially to the film thickness of the deposited film. The conductor film 12A exists only on the side wall of the mask 30 in the portion of the protruding island region 4. In the formation region of the bipolar transistor Tr, the conductor film 12A comes into contact with the surface of the n− well region 2A of the protruding island region 4 through the base opening 10. The conductor film 12A is left in the portions other than the protruding island region 4 (element isolation region), particularly in the formation region of the bipolar transistor Tr, for the purpose of flattening.

Next, the second layer conductor film 12B in the fabrication process is deposited over the entire surface of the substrate as shown in FIG. 15. This conductor film 12B uses the polycrystalline silicon film deposited by CVD, for example, and a p-type impurity is introduced into this polycrystalline silicon film in order to reduce the resistance value.

Figure 16:
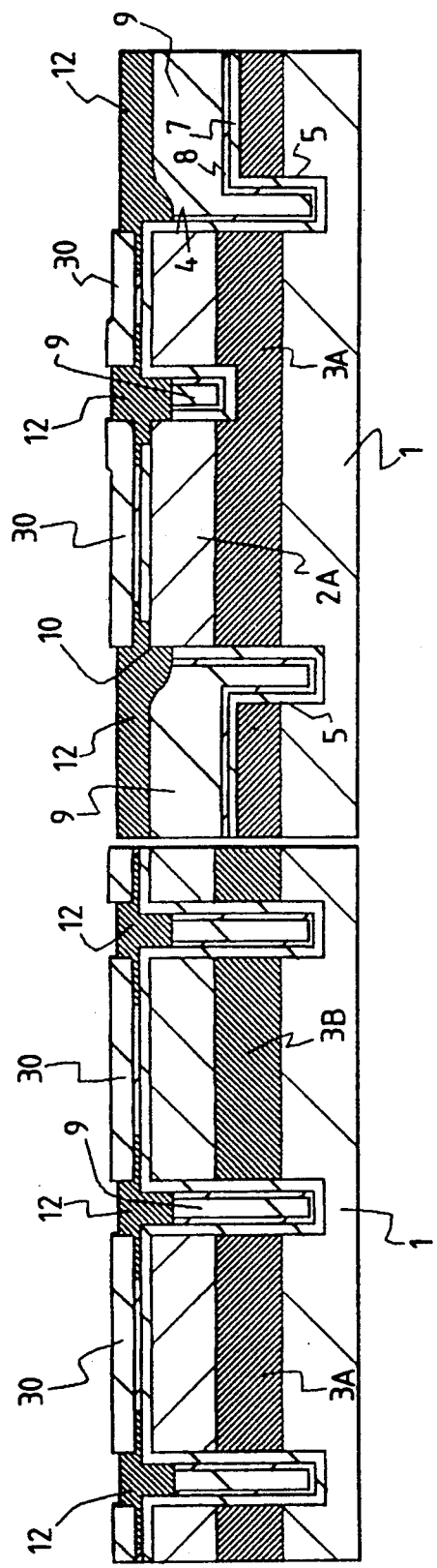

Etching is then applied to the entire surface of the substrate to etch the conductor films 12A and 12B to such an extent that the mask 30 on the protruding island region 4 is exposed as shown in FIG. 16. In this manner, the base lead-out electrode 12 is formed.

Next, the upper layer third mask 30C among the mask 30 is removed to expose the second mask 30B. After the base lead-out electrode 12 is patterned in a predetermined shape, the insulating film 13 is formed on the surface of the base lead-out electrode 12 by use of the second mask 30B. The insulating film 13 is made of the silicon dioxide film formed on the surface of the base lead-out electrode (polycrystalline silicon film) by thermal oxidation. Thereafter the second mask 30B of the mask 30 is removed.

Next, an n-type impurity is introduced into the main plane portion of the n⁻ well layer 2A of the protruding island region 4 in the formation region of the potential pull-up n⁺ semiconductor region (14) of the bipolar transistor Tr to form the collector potential pull-up n⁺ semiconductor region 14.

Figure 17:
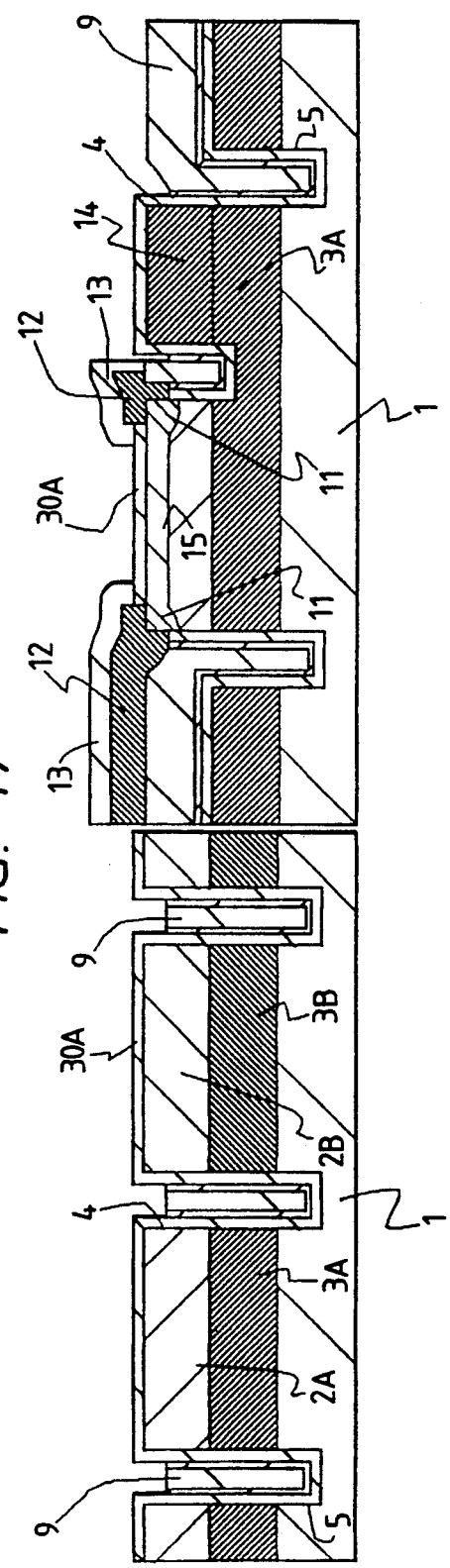
Figure 18:
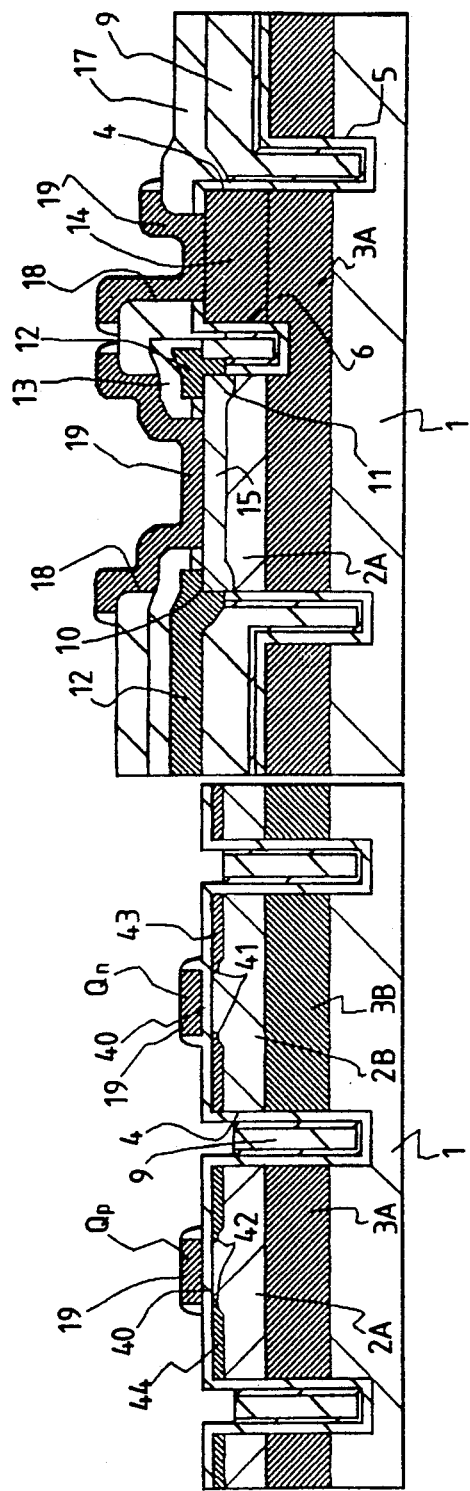

A p-type impurity is then introduced into the main place portion of the n⁻ well region 2A of the protruding island region 4 in the formation region of the intrinsic base region of the bipolar transistor Tr and the p type semiconductor region 15 which is used as the intrinsic base region is formed as shown in FIG. 17. The p⁺ semiconductor region 11 used as the graft base region is formed by the extension/diffusion step of this p-type impurity for forming the p semiconductor region 15 and by the previous heat-treatment. This p⁺ semiconductor region 11 is formed by the diffusion of the p-type impurity, which is introduced into the base lead-out electrode 12 coming into contact with the main plane of the n⁻ well region 2A through the base opening 10, into the main plane portion of the n⁻ well region 2A. As a result, the p⁺ semiconductor region 11 is formed in self-alignment with respect to the base lead-out electrode 12.

Next, the inter-level insulating film 17 is formed on the entire surface of the substrate. Thereafter the inter-level insulating film 17 on the protruding island region 4 of the bipolar transistor is removed (at this time, the first mask 30A is removed too) to open the emitter opening 18 and the collector opening 18. The emitter opening 18 is formed in such a manner as to have an opening size greater than the region defined by the end portion of the base lead-out electrode 12 on the side of the emitter opening 18 and eventually, the opening size of the emitter opening 18 is determined by the end portion of this base lead-out electrode 12. The inter-level insulating film 17 is removed in the formation region of the complementary MOSFET at the same step as the formation step of the emitter opening 18 and the collector opening 19, that is, the removing step of the inter-level insulating film 17. After this inter-level insulating film 17 is removed, the surface of the p⁻ well region 2B is exposed in the formation region of the n-channel MOSFET Qn and at the same time, the surface of the n⁻ well region 2A is exposed in the formation region of the p-channel MOSFET Qp.

The gate insulating film 40 is formed on the main plane of the p⁻ well region 2B in the formation region of the n-channel MOSFET Qn and on the main plane of the n⁻ well region 2A in the formation region of the p-channel MOSFET Qp, respectively.

Next, the emitter lead-out electrode 19 which comes into contact with the p type semiconductor region 15 through the emitter opening 18 is formed in the formation region of the bipolar transistor Tr and the collector lead-out electrode 19 which comes into contact with the potential pull-up n⁺ semiconductor region 14 through the collector opening 18 is formed. The gate electrode 19 is formed on the gate insulating film 40 in the formation region of the complementary MOSFET Q by the same fabrication step as that of the emitter and collector lead-out electrodes 19, 19. The emitter and collector lead-out electrodes 19, 19 and the gate electrode 19 consist of the third layer conductor film in the fabrication step such as the polycrystalline silicon film deposited by CVD, for example.

Next, the n semiconductor region 41 is formed on the main plane portion of the p⁻ well region 2B in the formation region of the n-channel MOSFET Qn. Thereafter the p type semiconductor region 42 is formed on the main plane portion of the n⁻ well region 2A in the formation region of the p-channel MOSFET Qp.

The side wall spacer, to which no reference numeral is given, is formed on the side wall of the gate electrode 19 at least in the formation region of the complementary MOSFET Q. This side wall spacer is formed by depositing the silicon dioxide film onto the entire surface of the substrate by CVD and then applying anisotropic etching such as RIE to the silicon dioxide film in the depth corresponding to the thickness of the deposited film.

Next, the n⁺ type semiconductor region 43 is formed on the main plane portion of the p⁻ well region 2B in the formation region of the n-channel MOSFET Qn. The n-channel MOSFET Q is substantially complete by this formation step of the n⁺ type semiconductor region 43. Thereafter the p⁺ type semiconductor region 44 is formed on the main plane portion of the n⁻ well region 2A in the formation region of the p-channel MOSFET Qp. The p-channel MOSFET Qp is substantially complete by this formation step of the p⁺ type semiconductor region 44.

Figure 19:
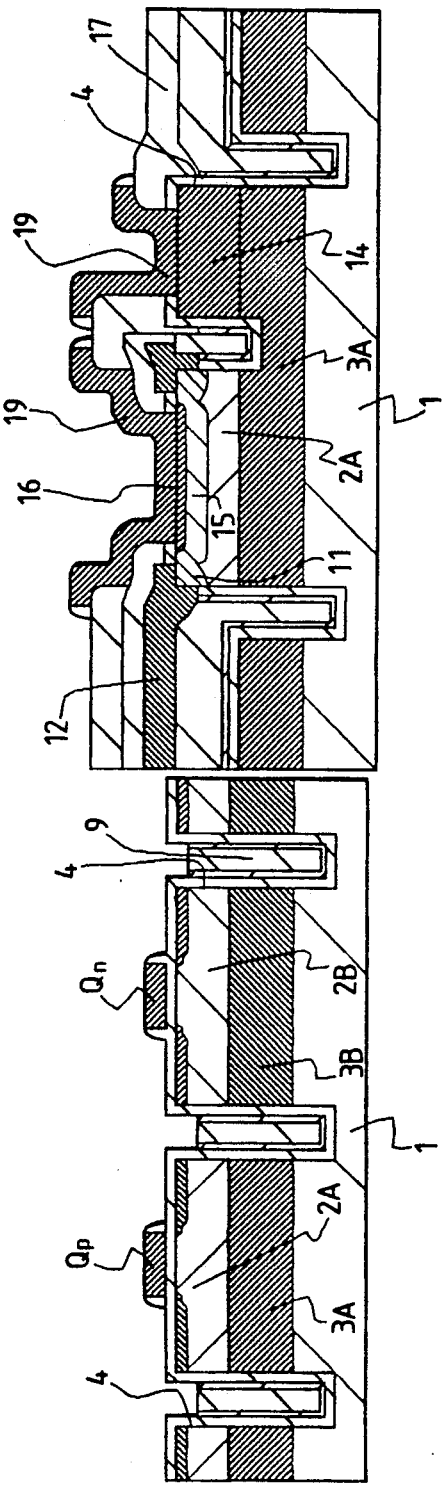

Next, an n-type impurity is introduced into the emitter lead-out electrode 19 in at least the formation region of the bipolar transistor Tr. Then, this n-type impurity is driven and diffused into the main plane portion of the p type semiconductor region 15 and thus the n⁺ type semiconductor region 16 which is used as the emitter region can be formed as shown in FIG. 19. When this emitter region is formed, the self-alignment type bipolar transistor Tr employing the SICOS structure of this embodiment is complete.

Next, the inter-level insulating film 20 is formed on the entire surface of the substrate, the connection hole 21 is bored in this inter-level insulating film 20 and the wiring 22 is formed as shown in FIG. 1. The wiring 22 is composed of the first layer wiring layer in the fabrication process.

Though not shown in FIG. 1, a final passivation film is thereafter formed on the upper layer of the wiring 17 or formed while interposing a plurality of layers of wirings. The Bi-CMOS device of this embodiment is thus complete through a series of fabrication steps described above.

In the fabrication method of the semiconductor integrated circuit device having the self-alignment type bipolar transistors Tr in the protruding island region 4 defined by the element isolation region, the fabrication method of the invention includes the steps of depositing the active layer (n⁻ epitaxial layer 2) used as the collector region on the main plane of the p⁻ type semiconductor substrate 1; forming the mask 30 on the main plane of the active layer in the formation region of the protruding island region 4; forming the thin trench 5 reaching the p⁻ type semiconductor substrate 1 in the active layer and forming the protruding island region 4 by the active layer in the region surrounded by this thin trench 5; and filling selectively the insulating material (at least the buried material 9) into the thin trench 5 and forming the element isolation region. According to this structure, substantially all the regions such as the protruding island region 4, the thin trench 5 of the element isolation region, and the like, can be formed in self-alignment with one mask 30 defining the protruding island region 4 being the reference.

All the fabrication steps from the formation step of the protruding island region 4 to completion of the operation regions of the self-alignment type bipolar transistor Tr can be carried out by use of only one mask 30. Moreover, each of these regions can be formed in self-alignment.

Since the element isolation region defining the periphery of the self-alignment type bipolar transistor Tr and the element isolation region defining the periphery of the complementary MOSFET Q can be formed by the same fabrication step, the formation step of either one of them can form the other so that the number of fabrication steps of the semiconductor integrated circuit device can be reduced.

Since the occupying area of each element isolation region can be reduced remarkably by use of the thin trench 5, the integration density of the semiconductor integrated circuit device can be improved.

Though the invention completed by the present inventor has thus been described in detail with reference to the embodiment thereof, the invention is not particularly limited thereto but can of course be changed or modified in various manners without departing from the gist thereof.

For example, the present invention can be applied to the semiconductor integrated circuit device consisting principally of bipolar transistors.

What is claimed is:

1. A semiconductor integrated circuit device comprising:
  a semiconductor body including a semiconductor substrate of a first conductivity type, an epitaxial layer formed on said semiconductor substrate and a buried semiconductor layer formed between said semiconductor substrate and said epitaxial layer, said epitaxial layer and said buried semiconductor layer being respectively of a second conductivity type opposite to said first conductivity type;
  a first protruding portion, and a hollow portion of said semiconductor body formed by removing predetermined unnecessary portions of said epitaxial layer of said semiconductor body, said hollow portion being adjacent to said first protruding portion and having an upper surface which extends to a lower height than an upper surface of said first protruding portion;
  an isolation groove formed in said body, which is formed along a side surface of said first protruding portion and in self-alignment with a peripheral edge portion of the upper surface of said first protruding portion, said isolation groove having an inner surface which corresponds to the side surface of said first protruding portion and extends inwardly from the upper surface of said hollow portion to said semiconductor substrate through said buried semiconductor layer;
  an insulating material formed on the upper surface of said hollow portion so as to fill said isolation groove;
  a first semiconductor region of said first conductivity type formed in said epitaxial layer of said first protruding portion, a portion of said first semiconductor region being exposed at the side surface of said first protruding portion;
  a second semiconductor region of said second conductivity type formed in said epitaxial layer of said first protruding portion on said first semiconductor region;
  a third semiconductor region of said second conductivity type, formed in said epitaxial layer of said first protruding portion under said first semiconductor region; and
  a polycrystalline silicon film formed on said insulating material in contact with at least said portion of said first semiconductor region at the side surface of said first protruding portion.

2. A semiconductor integrated circuit device according to claim 1, wherein said first semiconductor region is a base region of a bipolar transistor.

3. A semiconductor integrated circuit device according to claim 2, wherein said polycrystalline silicon film is formed in self-alignment with an upper peripheral edge portion of said first protruding portion.

4. A semiconductor integrated circuit device according to claim 3, wherein said polycrystalline silicon film is a base lead-out electrode of said bipolar transistor.

5. A semiconductor integrated circuit device according to claim 2, wherein said base region includes an intrinsic base region and a graft base region, said graft base region corresponding to the portion of said base region in direct contact with said polycrystalline silicon film.

6. A semiconductor integrated circuit device according to claim 5, wherein said polycrystalline silicon film is formed in self-alignment with an upper peripheral edge portion covering upper and side surface corner parts of said first protruding portion where said graft base region is formed.

7. A semiconductor integrated circuit device according to claim 6, wherein a collector region of a bipolar transistor comprises said third semiconductor region and said buried semiconductor layer which is disposed under said third semiconductor region.

8. A semiconductor integrated circuit device according to claim 7, wherein said first and said second semiconductor regions are base and emitter regions of said bipolar transistor, respectively.

9. A semiconductor integrated circuit device according to claim 2, wherein said second semiconductor region is an emitter region of said bipolar transistor.

10. A semiconductor integrated circuit device according to claim 8, wherein said third semiconductor region is a collector region of said bipolar transistor.

11. A semiconductor integrated circuit device according to claim 9, wherein said bipolar transistor is a self-alignment type transistor having each of its collector, base and emitter regions thereof formed in self-alignment with said first protruding region, and is composed of an SICOS structure wherein its emitter region, base region and collector region are disposed sequentially and vertically in said protruding island region.

12. A semiconductor integrated circuit device according to claim 11, wherein said base region includes an intrinsic base region and a graft base region, said graft base region corresponding to the portion of said base region in direct contact with said polycrystalline silicon film.

13. A semiconductor integrated circuit device according to claim 9, wherein said buried semiconductor layer is a heavily-doped layer which functions together with the third semiconductor region as the collector of said bipolar transistor and which is extended, in said semiconductor body, in a direction parallel to the upper surface of said protruding portion and which is connected to a lead-out collector region for coupling to an electrode wiring.

14. A semiconductor integrated circuit device according to claim 13, wherein said lead-out collector region is formed in said epitaxial layer of said semiconductor body and corresponds to an adjacently disposed but isolated second protruding portion having an upper surface which is substantially planar with the upper surface of said first protruding portion.

15. A semiconductor integrated circuit device according to claim 14, wherein said polycrystalline silicon film is formed in self-alignment with an upper peripheral edge portion of said first protruding portion.

16. A semiconductor integrated circuit device according to claim 14, further comprising an insulating film formed on said polycrystalline silicon film, wherein said second semiconductor region is formed in self-alignment with an upper peripheral edge portion of said protruding portion and is spaced apart from said upper peripheral edge portion by a substantially constant distance.

17. A semiconductor integrated circuit device according to claim 16, wherein said insulating film is a silicon oxide film formed by oxidizing a surface of said polycrystalline silicon film.

18. A semiconductor integrated circuit device according to claim 17, wherein said insulating material is a CVD SiO$_2$ film.

19. A semiconductor integrated circuit device according to claim 1, wherein said insulating material is a CVD SiO$_2$ film.

20. A semiconductor integrated circuit device according to claim 1, further comprising an insulating film formed on said polycrystalline silicon film, wherein said second semiconductor region is formed in self-alignment with an upper peripheral edge portion of said first protruding portion and is spaced apart from said upper peripheral edge portion by a substantially constant distance.

21. A semiconductor integrated circuit device according to claim 8, wherein said insulating film is a silicon oxidation film formed by oxidizing a surface of said polycrystalline silicon film.

22. A semiconductor integrated circuit device according to claim 7, wherein said insulating material is a CVD SiO$_2$ film.

23. A semiconductor integrated circuit device according to claim 1, wherein a collector region of a bipolar transistor comprises said third semiconductor region and said buried semiconductor layer which is disposed under said third semiconductor region.

24. A semiconductor integrated circuit device according to claim 23, wherein said first and said second semiconductor regions are base and emitter regions of said bipolar transistor, respectively.

25. A semiconductor integrated circuit device according to claim 24, wherein said polycrystalline silicon film is formed in self-alignment with an upper peripheral edge portion of said protruding portion.

26. A semiconductor integrated circuit device according to claim 1, wherein said insulating material is a deposited insulating material.

* * * * *